United States Patent [19]

Ma et al.

[11] Patent Number: 5,383,098
[45] Date of Patent: Jan. 17, 1995

[54] SHIELD ASSEMBLY

[75] Inventors: Scott T. Ma, Margate; William C. Phelps, III, Plantation, both of Fla.

[73] Assignee: Motorola, Inc., Schaumburg, Ill.

[21] Appl. No.: 959,501

[22] Filed: Oct. 9, 1992

Related U.S. Application Data

[63] Continuation of Ser. No. 762,129, Sep. 19, 1991, abandoned.

[51] Int. Cl.⁶ .............................................. H05K 9/00
[52] U.S. Cl. ........................ 361/818; 174/35 R; 174/35 GC; 220/4.02; 220/306; 361/752; 361/753; 361/758; 361/759; 361/816
[58] Field of Search ............ 174/35 R, 35 GC, 35 TS; 206/334, 472, 474, 478, 480, 482, 487–489; 220/4.02, 306, 615, 616, 621, 642, 646, 674, 682, 690, 691, DIG. 21, DIG. 25; 312/243, 250, 265; 361/752, 753, 758, 759, 816, 818

[56] References Cited

U.S. PATENT DOCUMENTS

| | | | |
|---|---|---|---|
| 3,631,299 | 12/1971 | Meyer | 361/399 |
| 4,626,962 | 12/1986 | Ahn et al. | 361/399 |
| 4,759,466 | 7/1988 | Chase et al. | 220/306 |
| 4,766,519 | 8/1988 | Heiland | 361/399 |
| 4,840,286 | 6/1989 | Heberling et al. | 220/306 |
| 4,912,602 | 3/1990 | Zurek et al. | 361/399 |
| 4,922,380 | 5/1990 | Kuki et al. | 361/399 |
| 4,945,448 | 7/1990 | Bremenour et al. | 361/399 |
| 5,001,603 | 3/1991 | Villaneuva, III et al. | 361/395 |
| 5,014,160 | 5/1991 | McCoy, Jr. | 361/424 |
| 5,045,971 | 9/1991 | Ono et al. | 361/424 |
| 5,150,282 | 9/1992 | Tomura et al. | 174/35 R |

FOREIGN PATENT DOCUMENTS

| | | | |
|---|---|---|---|
| 2460855 | 3/1981 | France | 220/306 |
| 3313967 | 10/1984 | Germany | 174/35 R |
| 3313970 | 10/1984 | Germany | 174/35 R |
| 2101970 | 1/1983 | United Kingdom | 220/306 |

*Primary Examiner*—Leo P. Picard
*Assistant Examiner*—Donald A. Sparks
*Attorney, Agent, or Firm*—Pedro P. Hernandez

[57] ABSTRACT

An electronic device assembly (100) includes a chassis (102), printed circuit boards (108 and 110), and a shield member (128). By placing the circuit boards (108 and 110) inside of chassis (102) and then engaging shield member (128), the printed circuits boards (108 and 110) are retained in place and shielded without the use of any other components. Shield member (128) includes a set of spring fingers (114) having tabs (116) which latch onto recesses (106) located on the side walls (132) of chassis (102). Upon the shield member (128) being engaged to chassis (102), the side walls (122) located on shield (128) press against printed circuit boards (108 and 110) and retain them in position without the use of additional fasteners.

8 Claims, 3 Drawing Sheets

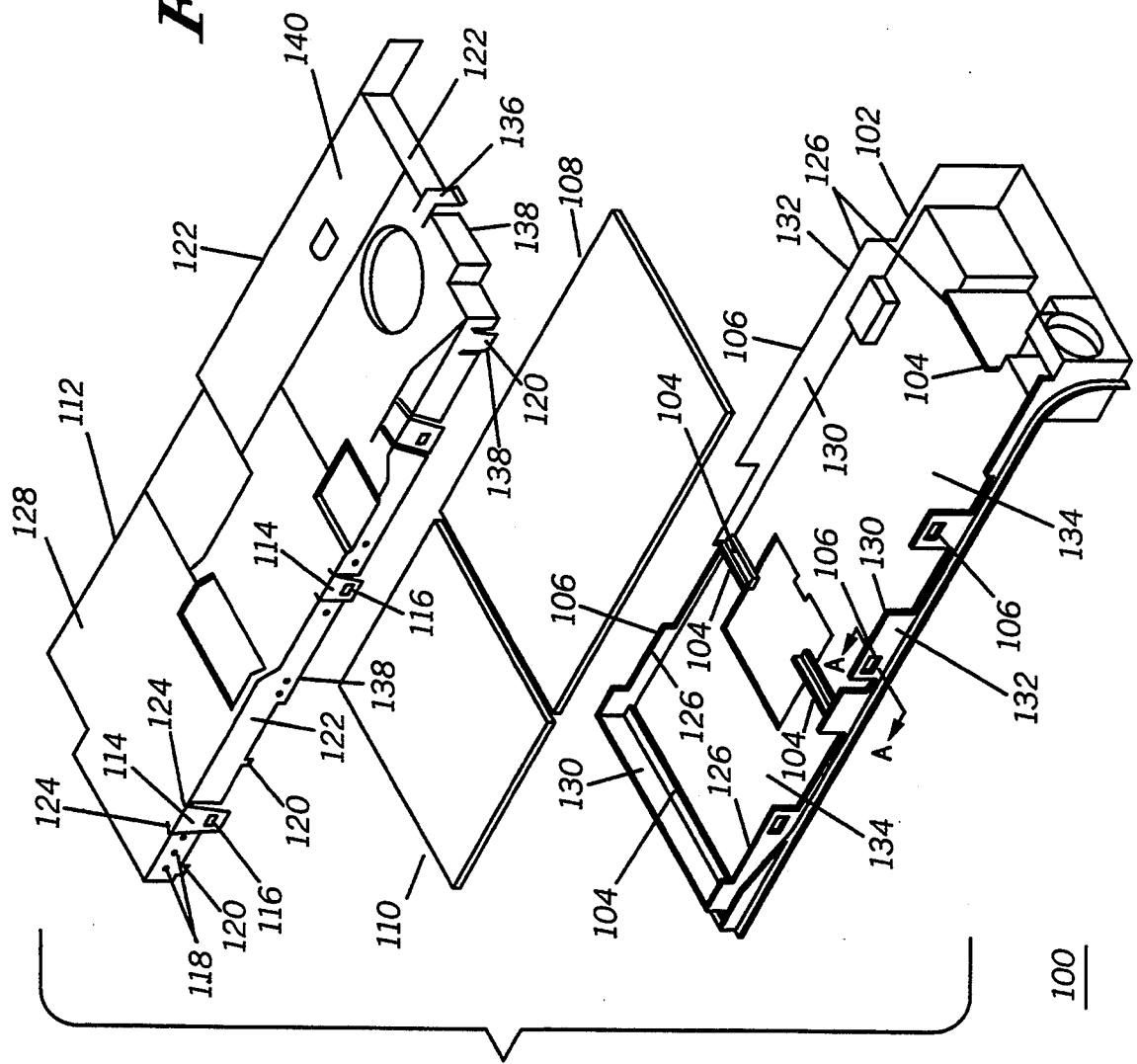

SHIELD ASSEMBLY

This is a continuation of application Ser. No. 07/762,129, filed Sep. 19, 1991, and now abandoned.

TECHNICAL FIELD

This invention relates generally to shield assemblies and more specifically to a shield assembly for use in communication devices.

BACKGROUND

Most known electronic device assemblies utilize fasteners such as screws to secure printed circuit boards onto the electronic device assemblies. In communication device assemblies, such as two way portable radio assemblies, it is sometimes also required to use shields substantially covering the printed circuit boards in order to shield the electronic circuits on the circuit boards from electromagnetic interference (EMI). This EMI is typically caused by the radio frequency emissions produced by the radio itself, or by the electronic circuits generating unwanted emissions which effect the overall performance of the radio. The addition of the shield, although helpful in minimizing EMI caused problems, presents major tolerance stack up design problems to the mechanical designer designing the electronic assembly. It becomes critical for the mechanical designer to maintain precise tolerances between the shield, the printed circuit board, and the main housing, in order to achieve maximum shielding with minimum space usage. A need thus exists for a way to minimize the tolerance stack up problems associated with the known shield assemblies and at the same time provide for a way to eliminate the use of separate fasteners (e.g. screws) to mount the printed circuit board onto the electronic assembly.

SUMMARY OF THE INVENTION

The present invention provides an improved shielded electronic assembly which eliminates the need for separate fasteners to retain the printed circuit board. The shielded electronic assembly, comprises a chassis having a plurality of recess locations and a shield member having a first surface, the shield member further having side walls substantially along the perimeter of the first surface. The assembly further includes a printed circuit board disposed between the housing member and the shield member. The shield member further includes a plurality of spring finger catches. The spring finger catches have tabs which latch to the recess locations found on the housing member thereby securing the shield member to the housing member. The shield member side walls retain the printed circuit board against the chassis when the spring finger tabs are latched to the recess locations.

In another aspect of the present invention a communication device utilizing the shielded electronic assembly is described.

BRIEF DESCRIPTION OF THE DRAWINGS

FIG. 1 is an exploded view of an assembly in accordance with the present invention.

DETAILED DESCRIPTION OF THE PREFERRED EMBODIMENT

Figure 2A:
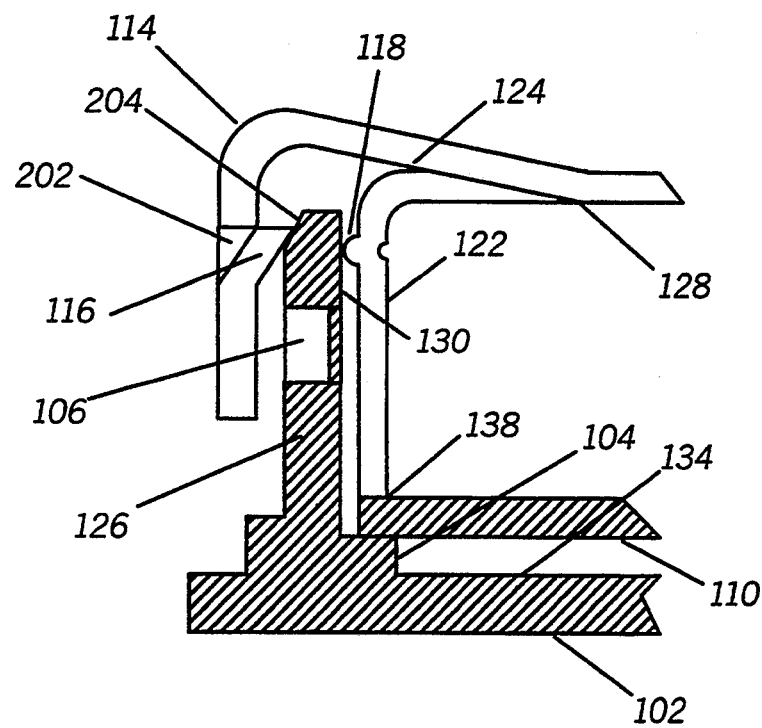
FIG. 2a is a partial cross-sectional view of the assembly of FIG. 1 along line A—A shown in an uncompressed state in accordance with the present invention.

Referring now to the drawings and in particular to FIG. 1, there is shown an exploded view of an electronic device assembly 100, comprising a chassis member such as a metal casting 102, a set of conventional printed circuit boards 108 and 110, and a metal shield 128. The chassis member 102 is preferably an aluminum casting formed by using conventional casting techniques as known in the art. Chassis 102 contains a plurality of retention means (recess locations) 106 in the form of recesses located selectively along side walls 126 of chassis 102. Side walls 126 have inner surfaces 130 and outer surfaces 132. Chassis 102 further includes support means 104 in the form of ledges found along selected areas of the inner surfaces 130 of side walls 126. Ledges 104 are used for supporting printed circuit boards 108 and 110 inside the cavity areas 134 defined by side walls 126. Printed circuit boards 108 and 110 can be conventional electronic circuit boards as known in the art.

Once printed circuit boards 108 and 110 are placed inside of chassis 102 and are resting on top of ledges 104, the boards (108 and 110) become retained by shield member 128 which takes the form of a single piece of metal, preferably 0.016 inch thick nickel-silver which is formed to include side walls 122. Shield member 128 also has a plurality of spring fingers 114 having tabs 116. Tabs 116 lock onto recess locations 106 when shield member 128 is engaged with the chassis 102. Spring fingers 114 are formed by forming slits along selected sections of first surface 140 and then bending the section into place, thereby helping to give spring fingers 114 their resilient (or springy) characteristics. Preferably, most of the spring finger contacts extend in front of side walls 122 of shield member 128 in order for the shield's sidewalls 122 to fit inside of side walls 126 of chassis 102.

Side walls 122 further include a plurality of protrusions 118 which are used for maintaining a pressure fit between shield 128 and chassis 102 once shield member 128 becomes engaged with chassis 102. Protrusions 118 are formed by stamping shield member 128 at selected locations with a press as known in the art. Protrusions 118 help maintain electrical contact between shield 128 and chassis 102 by creating a pressure fit between the side walls 122 of shield member 128 and the inner surface 130 of chassis side walls 126. In order to maintain the greatest attenuation against harmful EMI it is very important to maintain consistent ground contacts along the perimeter of shield 128 which protrusions 118 help achieve. In the preferred embodiment both shield member 128 and chassis 102 are at ground potential.

Shield member 128 also includes printed circuit board hold down tabs 120 in locations where the side walls 122 are shorter in height due to design considerations. The hold down tabs 120 help keep consistent pressure against printed circuit boards 108 and 110 along the perimeter of shield member 128. The bottom surfaces 138 of side walls 122 make contact with printed circuit boards 108 and 110 in order to retain them against chassis 102 upon shield 128 being connected to chassis 102. Also shown as part of shield member 128 is a spring retention finger 136 which applies a pressure fit against side wall 126 upon shield member 128 becoming engaged to chassis 102, thereby providing further retention between the two members (shield 128 and chassis 102).

In FIG. 2a, a partial cross-sectional view of the assembly of FIG. 1 along line A—A is shown in an uncompressed state in accordance with the present invention. A portion of chassis 102 is shown with side wall 126 including recess location 106. In the preferred embodiment, recess location 106 does not penetrate all the way through to inner surface 130 of side wall 126. Support means 104 which is the ledge along selected portions of inner wall 130 is also shown. A printed circuit board such as board 110 is placed inside of chassis 102 (e.g., the cavity 134 defined by side walls 126) with the board 110 resting on support means 104. Next, the shield 128 is placed in position, with the spring fingers in alignment with recess 106.

Side wall 126 preferably has a chamfered top portion 204 which helps guide the spring finger 114 while tab 116 is being engaged to recess 106. While spring fingers 114 are being guided along the chamfered top portion 204 of side wall 126, spring fingers 114 are being pressed outwardly by side walls 126. This allows spring fingers 114 to engage with recess locations 106 as shield 128 is pressed downward onto chassis 102. Tabs 116 on spring fingers 114 are preferably made by punching out a portion 202 of the spring finger which thereby creates tab 116. As the spring finger 114 is pressed downward into the chassis 102, tab 116 engages with the retention means 106 (recess location). The bottom portions 138 of the shield's side walls 122 at the same time place pressure against the circuit board 110 and help retain board 110 against chassis 102. Preferably, printed circuit board 110 receives its ground potential via the pressure contact printed circuit board 110 makes with ledge 104 or via the bottom surface 138 of side wall 122 which are at ground potential. The quantity of spring fingers 114 and recess locations 106 required in a given design will depend on such factors as the overall size of shield member 128, the size and weight of printed circuit boards 108 and 110, and the amount of engagement required between shield 128 and chassis 102.

Protrusions 118 help shield member 128 create a pressure fit against inner side walls 132 once shield member 128 is in place. Protrusions 118 also help maintain a good ground connection between the shield 128 and chassis 102. This helps increase the attenuation of unwanted EMI which would otherwise affect the performance of the electronic circuits located on circuit board 110. At the same time the protrusions 118 help minimize any EMI that is being produced by the circuits themselves, preventing these harmful emissions from affecting other portions of the overall electronic assembly 100. In communications applications in particular, the ability of having good shielding is critical because communication device produces large amounts of radio frequency energy which can adversely affect the electronic circuits found on printed circuit board 110.

As shown in FIG. 2a, spring finger 114 extends in front of side wall 122 in order to allow side wall 122 to fit inside of chassis 102, and thereby allows side wall 122 to apply pressure to inside wall surface 130 by way of protrusion 118. As side wall 122 moves downward into cavity 134, the bottom surface 138 of side wall 122 presses against board 110.

Since shield 128 is made from a thin sheet of metal such as aluminum, it absorbs any stack-up tolerance between the chassis 102, the board 110, and the shield 128 because spring finger 114 is resilient enough to absorb any tolerance problems associated with the overall assembly. This is due to the resilient nature of spring fingers 114 which allows shield 128 to give with minor tolerance differences caused by circuit boards (108 and 110) and chassis 102.

Figure 2B:
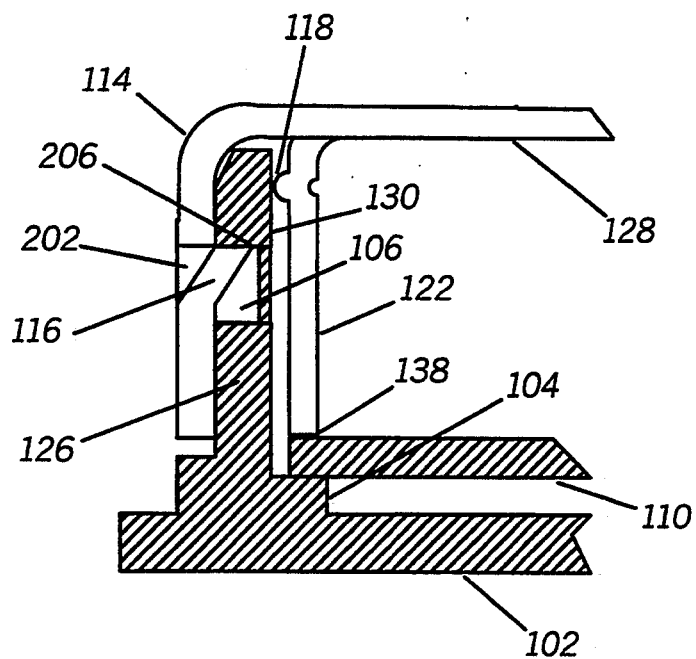
FIG. 2b is a view of FIG. 2a in the snapped-in stage in accordance with the present invention.

Referring to FIG. 2b, a partial cross-sectional view of the assembly of FIG. 1 along line A—A is shown in an compressed state in accordance with the present invention. Tab 116 is shown in FIG. 2b latched into retention means 106. Once tab 116 is engaged, it helps side walls 122 apply downward pressure onto board 110, thereby helping to retain board 110 in place. At the same time, the resilient characteristics of spring finger 114 help to apply an upward pressure between tab 116 and the upper wall 206 of retention means 106 end result of which is to latch shield 128 to chassis 102.

Figure 3:
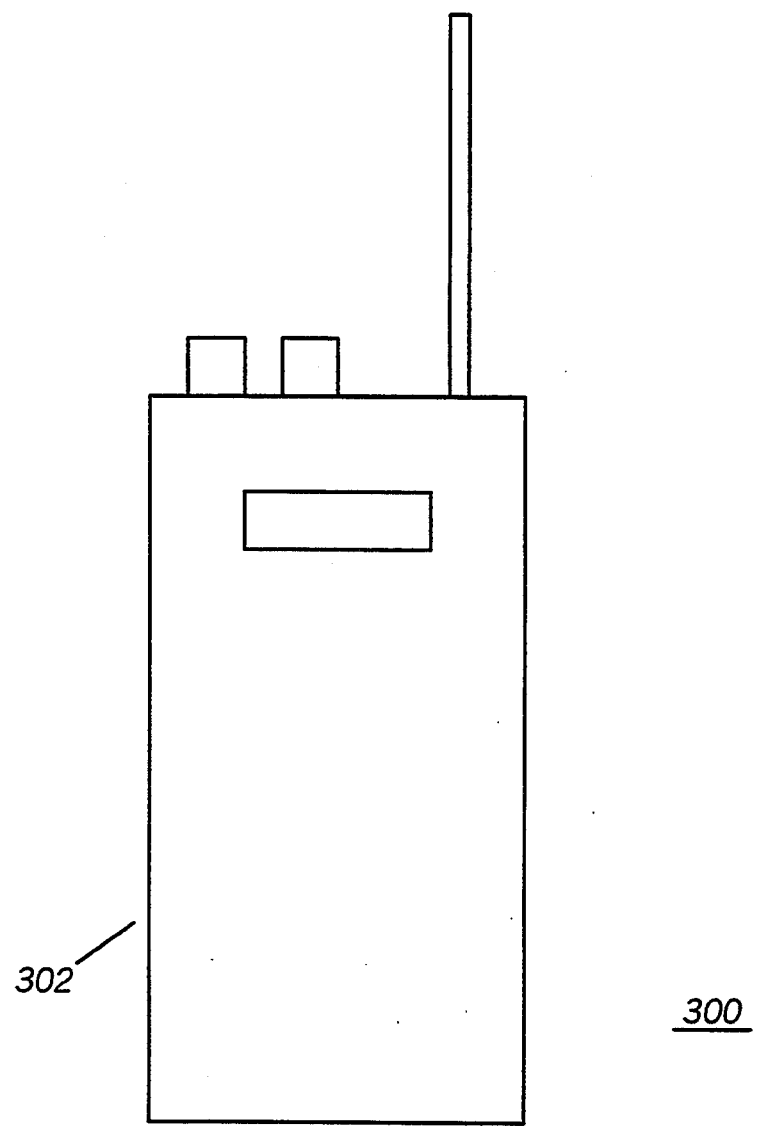
FIG. 3 is a front view of a communication device that utilizes the present invention.

In FIG. 3 a front view of a communication device 300 such as a portable radio, that utilizes the present invention, is shown. Radio 300 can be a conventional two-way radio, as known in the art, which includes an electronic shield assembly 100 (not shown) as discussed above. Communication device 300 includes a communication device housing 302 which receives the shielded electronic assembly 100 either partially or fully. Preferably housing 302 also includes space for batteries which are the power source for shielded electronic assembly 100.

By utilizing the present invention, a reduction in piece parts can be realized since no separate fasteners such as screws are required to hold down the printed circuit boards 108 and 110 to chassis 102. Also, the invention absorbs the stack up tolerances between the chassis 102, printed circuit boards 108 and 110, and the shield 128 itself. This absorption of tolerances is accomplished due to the springy characteristics of spring fingers 114 which are in essence resilient cantilever bodies with tabs. The invention also provides for a simple ground interface between the circuit boards 108 and 110 and shield member 128 since side walls 122 can apply pressure to boards 108 and 110, while providing for a pressure contact ground connection (e.g., the area where printed circuit board 110 makes contact with the bottom surface of side wall 122) while retaining boards 108 and 110 in place. The invention provides for a snap-in shield assembly capable of retaining printed circuit boards or electronic modules without the use of any additional fasteners.

In summary, the present invention provides for a way of achieving cost reduction and design simplicity for electronic assemblies which require circuit boards to be fastened and at the same time require shielding of the circuits. By reducing the number of parts required to design the assembly 100, an increase in product reliability can be accomplished, with the added benefit of minimizing stack up tolerance issues.

What is claimed is:
1. A shielded electronic assembly, comprising:
a chassis having side walls selectively along its perimeter, the side walls having a plurality of recess locations and bottom portions;
a shield member having a first surface, the shield member further having side walls substantially along the perimeter of the first surface;
a printed circuit board disposed between the chassis and shield member; and
the chassis side walls having inner and outer surfaces, the chassis side walls further defining a cavity area upon which the printed circuit board is placed and the chassis further including support ledges located within the cavity area for supporting the printed circuit board, the shield member further including a plurality of "L-shaped" cantilevered spring finger catches, the spring finger catches extend in front of the outer surface of the chassis side walls and latch on to the chassis side walls, thereby securing the shield member to the chassis and causing the bottom portions of the shield member side walls to retain the printed circuit board against the chassis when the spring finger catches are latched to the chassis side walls, the spring finger catches being resilient for compensating for tolerance variations in the shielded electronic assembly.

2. The shielded electronic assembly of claim 1, wherein the shield member is formed from a single piece of metal.

3. A shielded electronic assembly, comprising:
a chassis having side walls selectively along its perimeter, the side walls having a plurality of recess locations and bottom portions;
a shield member having a first surface, the shield member further having side walls substantially along the perimeter of the first surface;
a printed circuit board disposed between the chassis and shield member; and
the chassis side walls having inner and outer surfaces, the chassis side walls further defining a cavity area upon which the printed circuit board is placed and the chassis further including support ledges located within the cavity area for supporting the printed circuit board, the shield member further including a plurality of spring finger catches each having a tab, the spring finger catches extending in front of the chassis side walls, the tabs on the spring finger catches latch to corresponding recess locations found on the chassis side walls, thereby securing the shield member to the chassis and causing the bottom portions of the shield member side walls to retain the printed circuit board against the chassis when the spring finger tabs are latched to the recess locations, the spring finger catches being resilient for compensating for tolerance variations in the shielded electronic assembly, and the shield member further includes a plurality of protrusions located selectively along the side walls of the shield member, the protrusions providing for a pressure fit between the side walls of the shield member and the inner surface of the chassis side walls when the spring finger tabs are latched to the recess locations on the chassis.

4. The shielded electronic assembly of claim 3, wherein the chassis side walls have selectively chamfered top portions which help guide the spring finger tabs to the recess locations.

5. A communications device, comprising
a shielded electronic assembly, comprising:
a chassis having side walls selectively along its perimeter, the side walls having a plurality of recess locations and bottom portions;
a shield member having a first surface, the shield member further having side walls subtantially along the perimeter of the first surface;
a printed circuit board disposed between the chassis and shield member;
the chassis side walls having inner and outer surfaces, the chassis side walls further defining a cavity area upon which the printed circuit board is placed and the chassis further including support ledges located within the cavity area for supporting the printed circuit board, the shield member further including a plurality of "L-shaped" cantilevered spring finger catches, the spring finger catches extend in front of the outer surfaces of the chassis side walls and latch on to the chassis side walls, thereby securing the shield member to the chassis and causing the bottom portions of the shield member side walls to retain the printed circuit board against the chassis when the spring finger catches are latched to the chassis side walls the spring finger catches being resilient for compensating for tolerance variations in the shielded electronic assembly; and
a communication device housing for receiving the shielded electronic assembly.

6. The communication device of claim 5, wherein the shield member is formed from a single piece of metal.

7. A communications device, comprising
a shielded electronic assembly, comprising:
a chassis having side walls selectively along its perimeter, the side walls having a plurality of recess locations and bottom portions;
a shield member having a first surface, the shield member further having side walls subtantially along the perimeter of the first surface;
a printed circuit board disposed between the chassis and shield member;
the chassis side walls having inner and outer surfaces, the chassis side walls further defining a cavity area upon which the printed circuit board is placed and the chassis further including support ledges located within the cavity area for supporting the printed circuit board, the shield member further including a plurality of spring finger catches each having a tab, the spring finger catches extending in front of the chassis side walls, the tabs on the spring finger catches latch to corresponding recess locations found on the chassis side walls, thereby securing the shield member to the chassis and causing the bottom portions of the shield member side walls to retain the printed circuit board against the chassis when the spring finger tabs are latched to the recess locations, the spring finger catches being resilient for compensating for tolerance variations in the shielded electronic assembly;
a communication device housing for receiving the shielded electronic assembly; and
the shield member further includes a plurality of protrusions located selectively along the side walls of the shield member, the protrusions providing a pressure fit between the side walls of the shield member and the inner surface of the chassis side walls when the spring finger tabs are latched to the recess locations found on the chassis.

8. The communication device of claim 7, wherein the chassis side walls have selectively chamfered top portions for guiding the spring finger tabs to the recess locations.

* * * * *